US006351540B1

(12) United States Patent
Suzuki et al.

(10) Patent No.: US 6,351,540 B1
(45) Date of Patent: Feb. 26, 2002

(54) DIGITAL ECHO CIRCUIT

(75) Inventors: Satoshi Suzuki; Takayasu Kondo, both of Hamamatsu (JP)

(73) Assignee: Yamaha Corporation, Hamamatsu (JP)

( * ) Notice: Subject to any disclaimer, the term of this patent is extended or adjusted under 35 U.S.C. 154(b) by 0 days.

(21) Appl. No.: 09/396,091

(22) Filed: Sep. 14, 1999

(30) Foreign Application Priority Data

Sep. 22, 1998 (JP) .......................................... 10-286083

(51) Int. Cl.[7] .................................................. H03G 3/00
(52) U.S. Cl. ...................................... 381/63; 434/307 A
(58) Field of Search ................ 381/61, 63; 434/307 A; 84/626, 662, 630, 701, 707

(56) References Cited

U.S. PATENT DOCUMENTS 4,868,869 A * 9/1989 Kramer ........................ 381/61
5,131,051 A * 7/1992 Kishinaga et al. ............ 381/82
5,491,754 A * 2/1996 Jot et al. ....................... 381/63
5,570,424 A * 10/1996 Araya et al. .................. 381/61
5,596,646 A * 1/1997 Waller, Jr. et al. ............ 381/61
5,729,613 A * 3/1998 Poletti ......................... 381/63
5,753,845 A * 5/1998 Nagata et al. ................ 84/626
6,118,394 A * 9/2000 Onaya ........................ 341/110

* cited by examiner

*Primary Examiner*—Forester W. Isen
*Assistant Examiner*—Brian Pendleton
(74) *Attorney, Agent, or Firm*—Pillsbury Winthrop LLP

(57) ABSTRACT

An input musical sound signal is converted into a digital signal by an A/D converter (10), and then supplied to a feed back loop (22) having a digital delay circuit (16), so that an echo is produced. A distortion-adding block (28) is disposed in the feed back loop (22) to add distortion components corresponding to distortion and the like due to recording and reproducing processes of a tape-recorder-type analog echo, to the echo signal. The delay time of the digital delay circuit (16) is modulated, so that fluctuation components corresponding to, for example, wow and flutter components of a tape-recorder-type analog echo are added to the signal. The echo produced in the feed back loop (22) is returned to an analog signal by a D/A converter (24), and then added to the original sound by an adder (26). A result of the addition is then output.

15 Claims, 7 Drawing Sheets

DIGITAL ECHO CIRCUIT

BACKGROUND OF THE INVENTION

1. Field of the Invention

The present invention relates to a digital echo circuit which generates an echo of a musical sound signal by using a digital signal processing technique, so as to reproduce an analog echo sound.

The present application is based on Japanese Patent Application No. Hei. 10-286083, which is incorporated herein by reference.

2. Description of the Related Art

A recent karaoke apparatus has a function of adding various effects and an echo to vocal sound by using a digital signal processing technique. FIG. 2 shows a related digital echo circuit which adds an echo to a musical sound signal such as vocal sound. An input musical sound signal is converted into a digital signal by an A/D converter 10. An amplifier 12 adds an input gain to the digital signal. The resulting digital signal is supplied via an adder 14 to a digital delay circuit 16 so as to be delayed by a predetermined time thereby. The characteristics of the output data of the digital delay circuit 16 are appropriately corrected by an equalizer 18. A feedback gain is added to the corrected output data by an amplifier 20. The corrected output data is then fed back to the adder 14 to be added to input data. The echo signal data which is produced in the feed back loop 22 is returned to an analog signal by a D/A converter 24. In a mixing circuit 26, the analog signal is mixed with the original musical sound signal (dry sound signal) and then output. The reverberation time of the echo is adjusted by the input gain which is added by the amplifier 12, and the feedback gain which is added by the amplifier 20.

In the digital echo circuit of FIG. 2, an echo is generated by using a digital signal processing technique. Therefore, the generated echo is free from distortion and fluctuation, and results in an excessively regular echo. As compared with an analog echo, the digitally generated echo produces a simple effect and is heard as a cold sound.

SUMMARY OF THE INVENTION

It is an object of the present invention to provide a digital echo circuit which can solve the problem of the related art, and can reproduce a sound of an analog echo.

In the present invention, in a digital echo circuit in which a musical sound signal data configured by a digital signal is supplied to a feedback loop having a digital delay circuit thereby generating an echo. A digital signal processing circuit is disposed in the feed back loop, and adds data corresponding to distortion components of an analog signal to the musical sound signal data in the feedback loop. According to the present invention, waveform distortion components are added to the generated echo signal, so that distortion components and the like due to recording and reproducing processes of a tape-recorder-type analog echo can be reproduced, and a warm echo similar to an analog echo can be obtained.

For example, the digital signal processing circuit which adds data corresponding to waveform distortion components of an analog signal to the musical sound signal data in the feedback loop may comprise a squaring circuit which squares the musical sound signal data in the feedback loop, or a level converting circuit which conducts a process corresponding to a level conversion of an analog signal on the musical sound signal data in the feedback loop in accordance with a function of a predetermined level conversion characteristic. In this case, for example, the level converting circuit may use a gain table which stores data values of the function of the level conversion characteristic, and reads out data corresponding to an input data value from the gain table, and then outputs the readout data. Alternatively, the level converting circuit may be configured so as to have programs of the function of the level conversion characteristic itself, calculate the output data from the function in accordance with the input data, and output the calculated data.

In the present invention, in a circuit in which a musical sound signal data configured by a digital signal is supplied to a feedback loop having a digital delay circuit thereby generating an echo, a delay time of the digital delay circuit is modulated with a frequency of 10 Hz or lower. According to the present invention, fluctuation components are added to an echo signal, so that wow and flutter components of a tape-recorder-type analog echo and the like can be reproduced, and a warm echo similar to the analog echo can be obtained.

Further, in the present invention, preferably, the digital signal processing circuit has a low-cut filter for removing DC components from the squared musical sound signal data.

Still further, in the present invention, preferably, the digital signal processing circuit has a cubing circuit disposed so as to generate triple components.

Furthermore, in the present invention, preferably, the digital signal processing circuit has an X-fold amplifier and a 1/X-fold amplifier connected in series, the musical sound signal is clipped by the X-fold amplifier, and the clipped signal is returned by the 1/X-fold amplifier.

DETAILED DESCRIPTION OF THE PREFERRED EMBODIMENT

Figure 1:
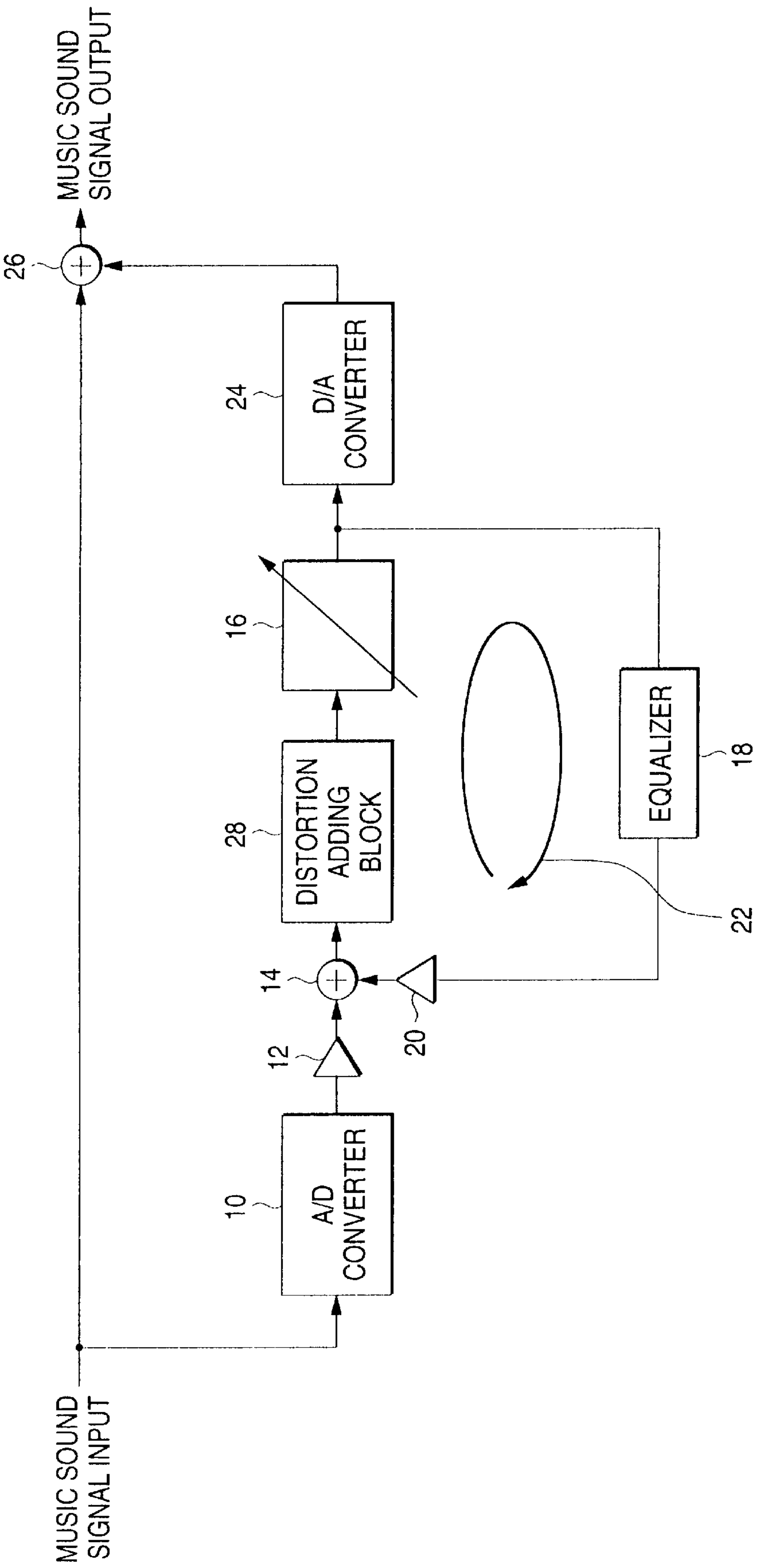
FIG. 1 is a block diagram showing an embodiment of the present invention.
Figure 2:
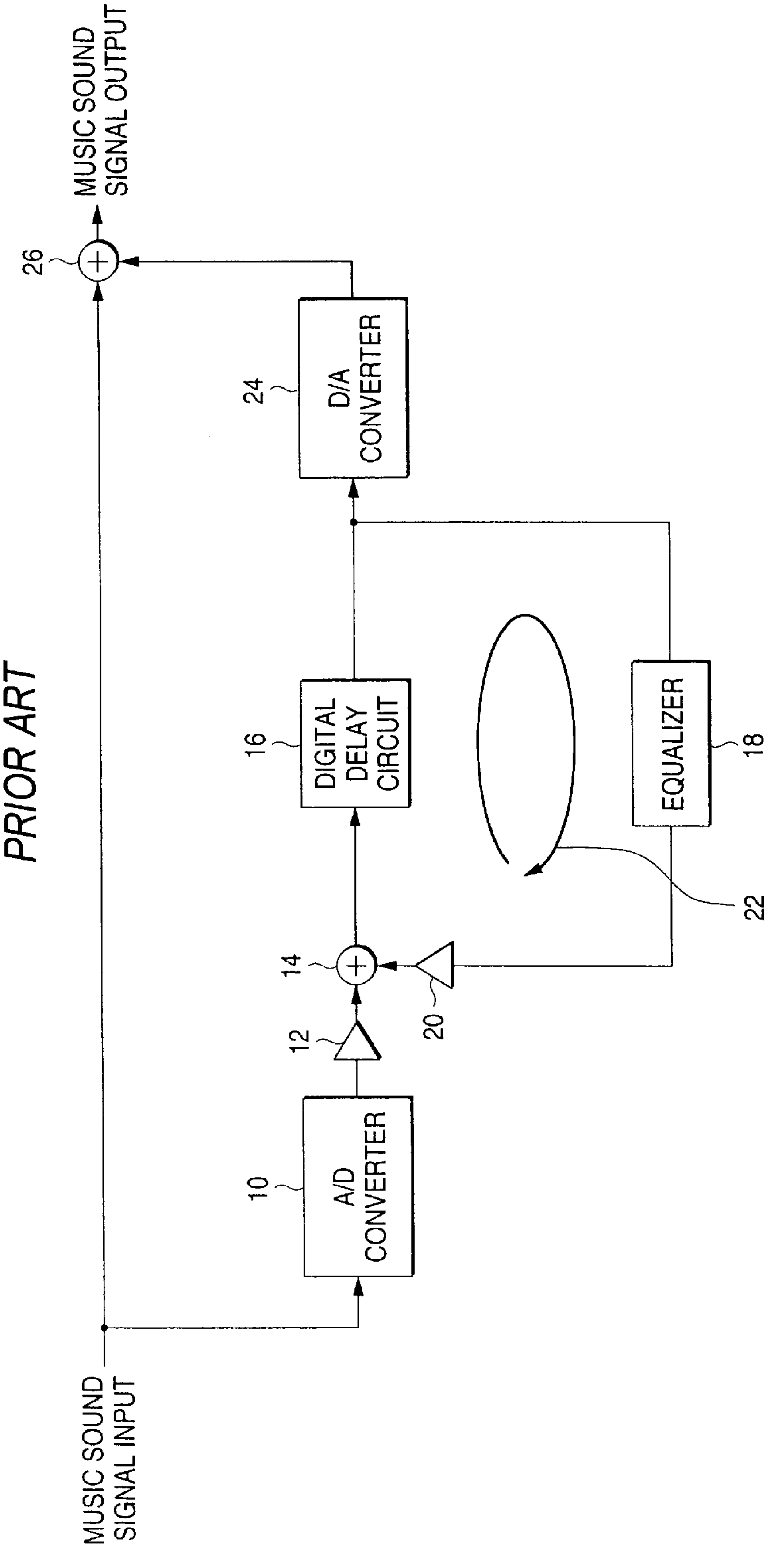
FIG. 2 PRIOR ART
FIG. 2 is a block diagram showing a related digital echo circuit.

FIG. 1 shows an embodiment of the present invention. The portions identical with those of FIG. 2 are denoted by the same reference numerals. An input musical sound signal such as vocal sound is converted into a digital signal by the A/D converter 10. The amplifier 12 adds an input gain to the digital signal. The resulting digital signal is supplied via the adder 14 to a distortion-adding block 28 in which distortion components imitating waveform distortion and the like due to recording and reproducing processes of a tape-recorder-type analog echo are added to the digital musical sound signal. The musical sound signal to which distortion components are added is delayed by a predetermined time by the digital delay circuit 16. The delay time of the digital delay circuit 16 is modulated with an appropriate frequency (for example, 10 Hz or lower), so that fluctuation components imitating wow and flutter components of a tape-recorder-type analog echo or the like are added to the signal. The characteristics of the output data of the digital delay circuit 16 are appropriately corrected by the equalizer 18. A feedback gain is added to the corrected output data by the amplifier 20. The corrected output data is then fed back to the adder 14 to be added to an input data. The echo signal data which is produced in the feed back loop 22 is returned to an analog signal by the D/A converter 24. In the mixing circuit 26, the analog signal is mixed with the original musical sound signal (dry sound signal) and then output. The reverberation time of the echo is adjusted by the input gain which is added by the amplifier 12, and the feedback gain which is added by the amplifier 20.

Figure 3:
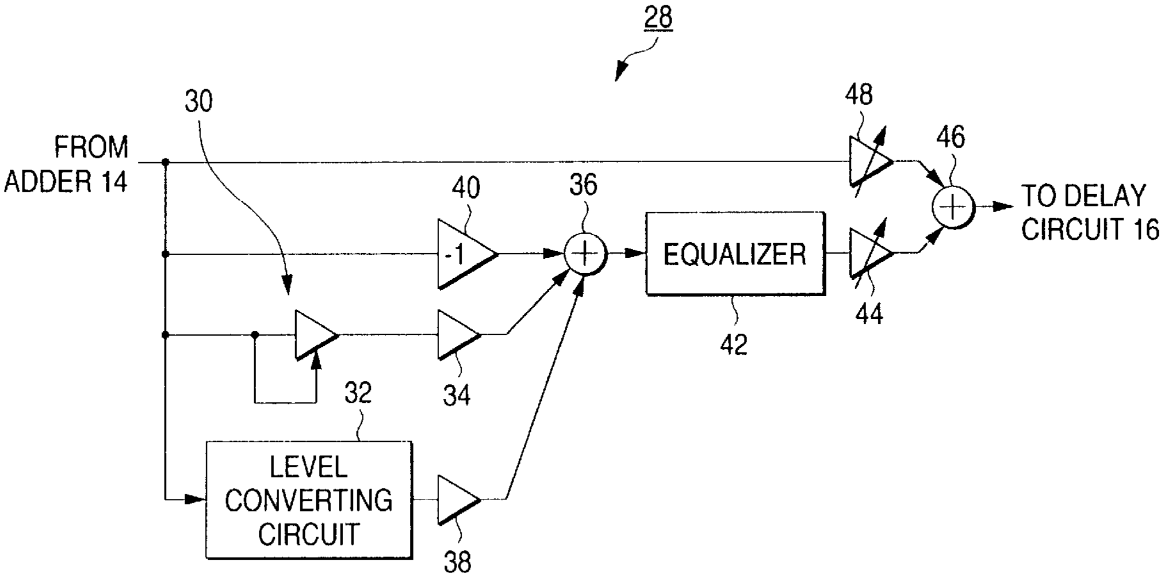
FIG. 3 is a block diagram showing a specific example of the distortion-adding block 28 of FIG. 1.

FIG. 3 shows a specific example of the distortion-adding block 28. The musical sound signal from the adder 14 (FIG. 1) of the feed back loop 22 is squared by a squaring circuit 30 so as to produce double-frequency components. In parallel with this process, the musical sound signal output from the adder 14 is supplied to a level converting circuit 32. The level converting circuit 32 comprises, for example, a gain table (a memory such as a ROM) which stores data values of a function of predetermined input/output characteristics (i.e., level conversion characteristics) for adding the distortion components to the input signal and then outputting the signal. The level-converting circuit converts the level (i.e., the value of the digital data) of the musical sound signal in the feed back loop 22, in accordance with the gain table. For example, the characteristics of the gain table are set to those of a function of odd order (odd function), so that odd multiple frequency components are added as the distortion components to the input musical sound signal and the resulting signal is then output.

Figure 4A:
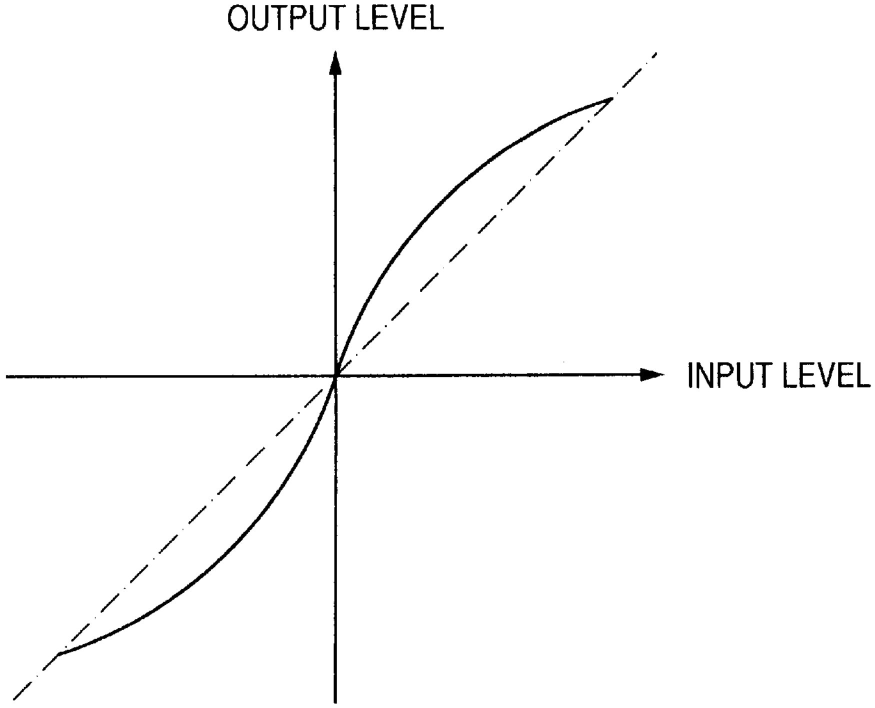
FIGS. 4A and 4B show an example of level-conversion characteristics of the level converting circuit 32 of FIG. 3.
Figure 4B:
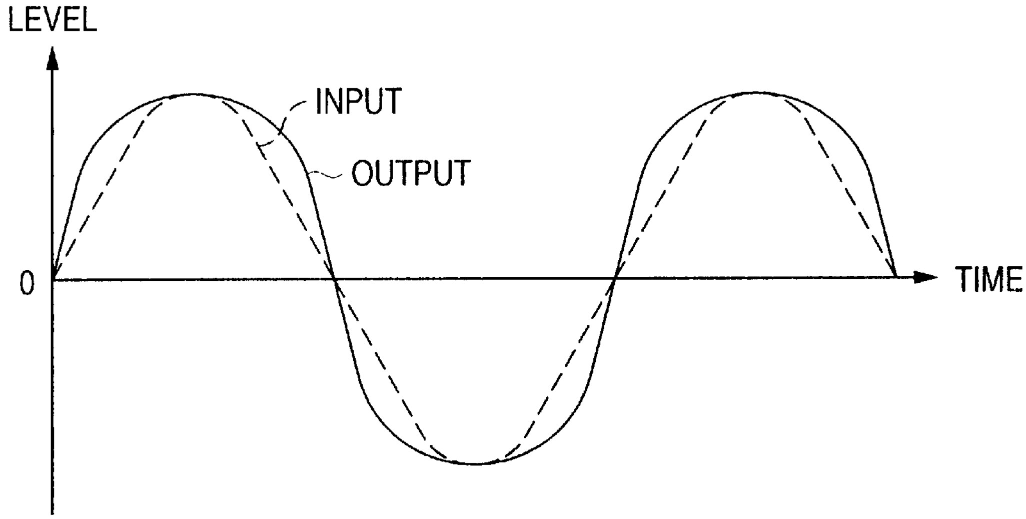

An example of the characteristics of the gain table is shown by the solid line of FIG. 4A. When an input data corresponding to a sinusoidal analog signal waveform indicated by a broken line in FIG. 4B is level-converted, an output data corresponding to an analog signal waveform indicated by a solid line in FIG. 4B is obtained. The characteristics of FIG. 4A are point-symmetric about the origin.

Therefore, data to be stored in the gain table may be restricted to those of only one of the positive and negative sides, and, in accordance with the polarity of the input data, the polarity may be added to the readout output data, so that the number of stored data can be reduced.

The level converting circuit 32 is not restricted to a gain table, and may be configured by a calculating circuit which has programs of the function of the level conversion characteristic itself, and which calculates the output data from the function in accordance with the input data.

Referring to FIG. 3, an appropriate gain is added to the output data of the squaring circuit 30 by a double component addition gain adding amplifier 34, and the data is then supplied to an adder 36. An appropriate gain is added to the output data of the level converting circuit 32 by an odd multiple component addition gain adding amplifier 38, and the resulting data is supplied to the adder 36. In order to eliminate components of direct sound, the data which has not undergone the squaring process and the level converting process is multiplied by −1 in an inverting amplifier 40, and then supplied to the adder 36. The adder 36 adds the three data together, and outputs the result of the addition as the distortion component data.

The distortion component data is supplied to an equalizer 42 in which a low-cut filter (having a cut-off frequency of, for example, 10 Hz) and a high-cut filter (having cut-off frequencies of, for example, 5 kHz, 10 kHz, . . . , which can be selectively switched over in accordance with the echo mode selected by a user) are connected in series. Processes of removing DC components and reducing high-order distortion components are conducted on the data.

The gain of the distortion component data output from the equalizer 42 is adjusted by a variable amplifier 44. The data is then supplied to an adder 46. By contrast, the gain of the original musical sound signal data is adjusted by a variable amplifier 48, and then supplied to the adder 46. The adder 46 mixes the two inputs with each other, and then outputs the musical sound signal data to which the distortion component is added. The mixing ratio of the two inputs can be set by the variable amplifiers 44 and 48. The variable amplifiers 44 and 48 may be configured by crossfaders which are interlocked with each other.

Figure 5:
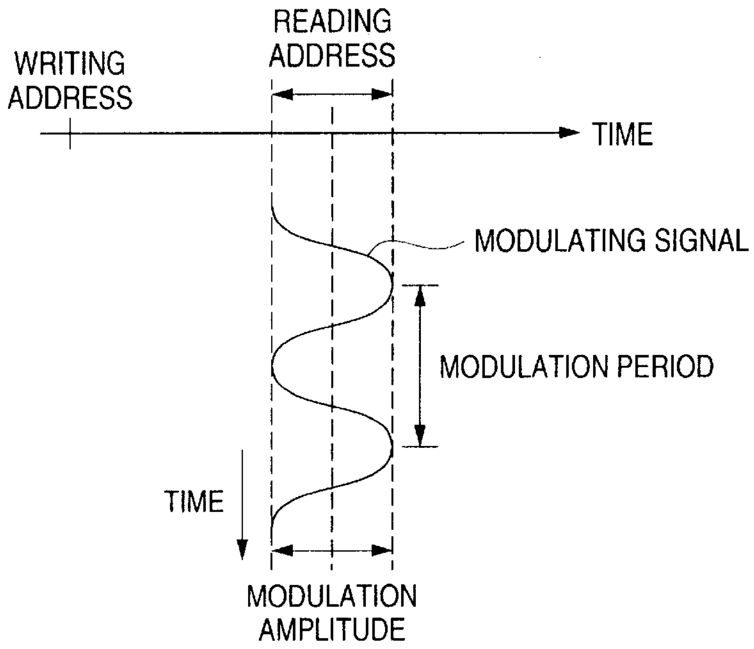
FIG. 5 is a diagram showing an operation of modulating the delay time in the digital delay circuit 16 of FIG. 1.

For example, the digital delay circuit 16 of FIG. 1 may be configured by a RAM. In this case, the delay time can be set by a difference between the writing address and the reading address. While the writing address is sequentially advanced at a predetermined timing, the reading address may be modulated so that the difference between the writing address and the reading address is varied, whereby the delay time is modulated. FIG. 5 diagrammatically shows an example of modulation which is applied to the reading address. The abscissa of FIG. 5 shows the relative time of the reading address with respect to the writing address. When the reading address is varied in time series by using a modulating signal, the difference between the writing address and the reading address is varied. As the modulating signal, a sinusoidal wave, a triangular wave, or the like may be used. For example, the modulation amplitude is ±2.65 msec (in the case of a sampling frequency of 48 kHz, corresponding to ±127 samples), and the modulation frequency is 0.046 to 5.81 Hz.

In the circuit of FIG. 1, in accordance with a user's selection of the echo mode or the like, the addition of distortion and the modulation of the delay time can be turned on/off. The addition and the modulation can be manually or automatically set to either of the states where both the processes are turned on, where only one of the processes is turned on, and where both the processes are turned off. Also the amount of distortion to be added, and the amplitude and frequency of modulation of the delay time can be manually or automatically adjusted in accordance with the user's selection of the echo mode or the like.

Figure 6:
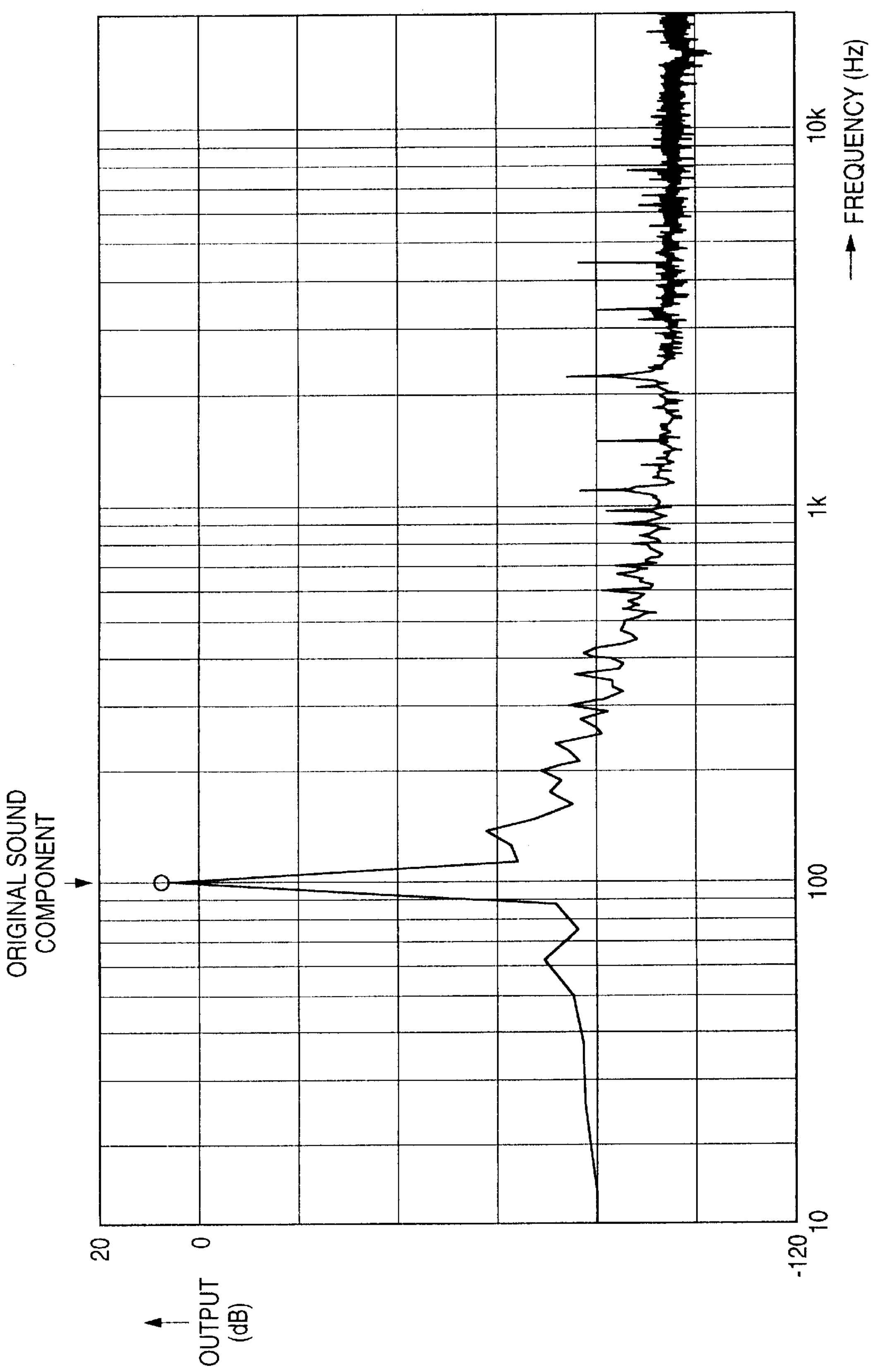
FIG. 6 is a characteristic diagram of an output signal in the case where a signal of 100 Hz is supplied to the circuit of FIG. 2.
Figure 7:
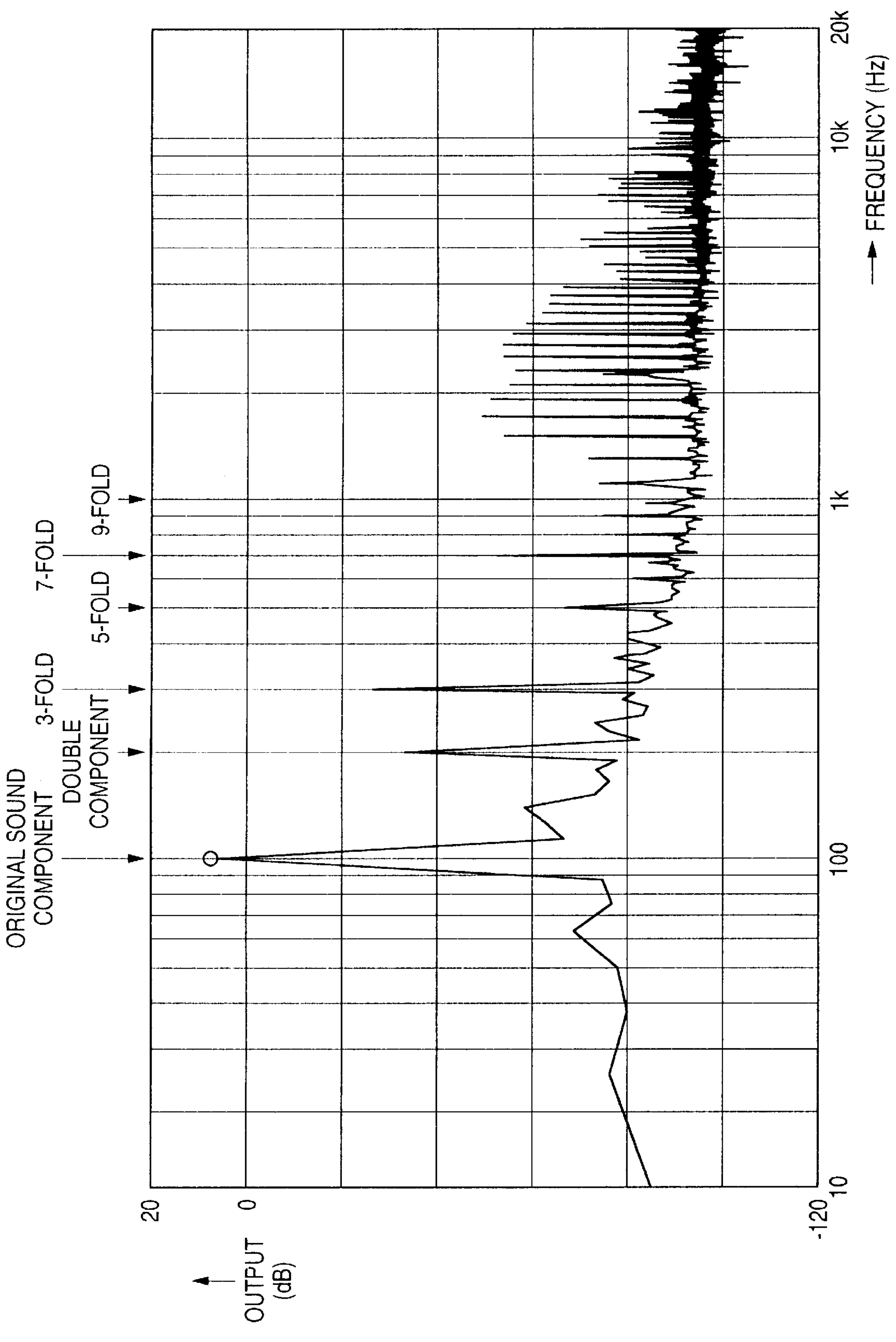
FIG. 7 is a characteristic diagram of an output signal in the case where a signal of 100 Hz is supplied to the circuit of FIG. 1.

Hereinafter, the difference in characteristics between the output signal of the related circuit and that of the circuit of FIG. 1 according to the present invention will be described. FIG. 6 shows characteristics of the-output signal of the related circuit in the case where a signal of 100 Hz is input. FIG. 7 shows characteristics of the output signal of the circuit of FIG. 1 according to the present invention in the case where a signal of 100 Hz is input (i.e., the delay time is not modulated). FIG. 7 shows distortion components of double component (square component) and odd multiple components added to the signal.

Figure 8:
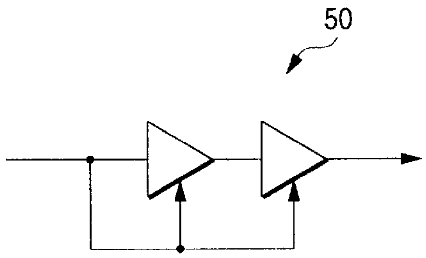
FIG. 8 is a block diagram showing another specific example of the distortion-adding block of FIG. 1.
Figure 9:
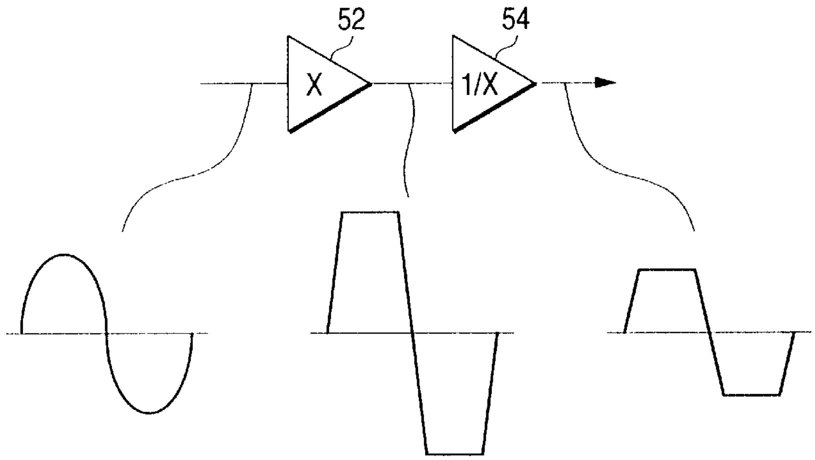
FIG. 9 is a block diagram showing a further specific example of the distortion-adding block of FIG. 1.

In place of the circuit shown in FIG. 3 (or in parallel with the circuit), either of the following circuits may be used as the distortion-adding block 28. As shown in FIG. 8, a cubing circuit 50 is disposed so as to generate triple components, including one-fold components. Alternatively, as shown in FIG. 9, a circuit may be disposed in which an X-fold amplifier 52 and a 1/X-fold amplifier 54 are connected in series, a signal is clipped by the X-fold amplifier 52, and the signal is then returned by the 1/X-fold amplifier 54, thereby generating a clipped signal, generating odd multiple components.

Figure 10:
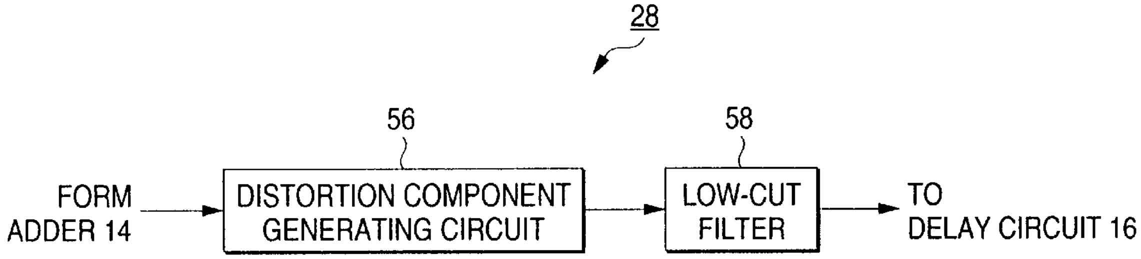
FIG. 10 is a block diagram showing a still further specific example of the distortion-adding block of FIG. 1.

In the circuit of FIG. 3, only distortion components are generated, the distortion components are added to the original data, and a result of the addition is output. Alternatively, as shown in FIG. 10, the circuit may be simply configured so that data which is output from a distortion component generating circuit 56 (a squaring circuit, a cubing circuit, a level converting circuit, a signal clipping circuit, or the like) to which distortion components are added is used as it as, and DC components are removed by a low-cut filter 58.

What is claimed is:

1. A digital echo adding circuit, comprising:

a distortion adding circuit to digitally add distortion components to an input signal, the distortion adding circuit having an inverting circuit to receive and invert in polarity the input signal, a distortion component generating circuit to raise the input signal to an n-th power to a generate an n-times frequency component that is n-times that of the input signal, n being an integer, a level-converting circuit to convert a level of the input signal according to a predetermined level conversion characteristic function, a first adder to add output signals of the inverting circuit, the distortion component generating circuit, and the level-converting circuit, and output an added signal, and a second adder to add the input signal and the added signal of the first adder, to create an output signal of the distortion adding circuit;

a digital delay circuit to delay the delayed signal of the distortion adding circuit by a predetermined time and digitally output a delayed signal; and an equalizer circuit to receive the output signal of the digital delay circuit, to provide the delayed signal with a predetermined frequency characteristic, and output a resultant signal to the distortion adding circuit to form a feedback circuit.

2. A digital echo adding circuit according to claim 1, wherein "n" in the distortion component generating circuit equals "2".

3. A digital echo circuit according to claim 1, further including a low-pass filter for removing DC components of the output signal of the distortion component generating circuit.

4. A digital echo adding circuit according to claim 1, wherein "n" in the distortion component generating circuit equals "3".

5. A digital echo circuit according to claim 1, further including an X-fold amplifier and a 1/X-fold amplifier connected in series, wherein the digital musical sound signal is clipped by the X-fold amplifier and then returned by the 1/X-fold amplifier.

6. A digital echo circuit according to claim 1, wherein the digital delay circuit delays the output signal of the distortion component generating circuit by a delay time modulated by a predetermined frequency.

7. A digital echo circuit according to claim 6, wherein the digital delay circuit includes a memory and a delay time set in the memory by a difference between a writing address and a reading address.

8. A digital echo adding circuit according to claim 6, wherein the predetermined frequency is no greater than 10 KHz.

9. A digital echo adding circuit according to claim 1, wherein the level converting circuit includes a gain table.

10. A digital echo adding circuit according to claim 1, further including a D/A converter, located at an output side of the digital delay circuit, to convert the delayed signal of the digital delay circuit into an analog signal, and to output the analog signal.

11. A digital echo adding circuit according to claim 1, wherein the level-converting circuit performs level conversion according to an odd function characteristic.

12. A digital echo adding circuit according to claim 1, further including an A/D converter, located at an input side of the digital adding circuit, to receive an analog musical sound signal, to convert the analog musical sound signal into a digital signal, and to output the digital signal to the distortion component generating circuit.

13. A digital echo adding circuit according to claim 1, further including a D/A converter to receive the delayed signal from the digital delay circuit and convert the delayed signal into an analog signal.

14. A method of digitally adding distortion components to a digital musical sound signal, the method comprising:

receiving and inverting in polarity an input signal;

raising the inverted input signal to an n-th power to a generate an n-times frequency component that is n-times that of the inverted input signal, n being an integer;

converting a level of the input signal to a distortion adding circuit according to a predetermined level conversion characteristic function to create a converted signal;

adding the inverted input signal, the n-times frequency components and the converted signal, and outputting a first added signal;

adding the input signal to the first added signal to create an output signal of a distortion adding circuit;

delaying the output signal of the distortion adding circuit by a predetermined time and digitally outputting a delayed signal; and receiving the delayed signal, utilizing an equalizer to give the delayed signal a predetermined frequency characteristic, and outputting a resultant signal to the distortion adding circuit to form a feedback circuit.

15. The method according to claim 14, further including delaying the output signal of the distortion component generating circuit by a delay time modulated by a predetermined frequency.

* * * * *